US008373989B2

(12) United States Patent
Gong et al.

(10) Patent No.: US 8,373,989 B2
(45) Date of Patent: Feb. 12, 2013

(54) FAN FIXING DEVICE AND FAN MODULE HAVING SAME

(75) Inventors: Xin-Hu Gong, Shenzhen (CN); Si-Wen Shu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 167 days.

(21) Appl. No.: 13/082,405

(22) Filed: Apr. 8, 2011

(65) Prior Publication Data

US 2012/0162915 A1    Jun. 28, 2012

(30) Foreign Application Priority Data

Dec. 24, 2010  (CN) .......................... 2010 1 0605126

(51) Int. Cl.
*H05K 7/20*    (2006.01)

(52) U.S. Cl. .................... 361/695; 361/692; 361/679.47; 361/679.48; 361/679.49; 165/80.3; 165/104.33; 165/121; 165/122; 454/184; 415/119; 415/213.1; 415/214.1; 416/244 R; 417/423.14; 417/423.15; 248/224.61; 248/229.2

(58) Field of Classification Search .. 361/679.46–679.5, 361/690–697, 724–728; 165/80.2, 80.3, 165/104.33, 104.34, 185, 121–126; 454/184; 248/27.1, 224.61, 229.2, 229.22, 562, 599, 248/635, 639; 415/60, 61, 119, 126, 213.1, 415/214.1, 220, 121.2, 186, 208.1, 209, 211.2, 415/216.1; 416/144 R, 247 R, 244 R, 69, 416/70 R; 417/423.14, 423.15
See application file for complete search history.

(56) References Cited

U.S. PATENT DOCUMENTS

| 6,556,437 | B1* | 4/2003 | Hardin | 361/679.48 |
|---|---|---|---|---|
| 6,603,661 | B2* | 8/2003 | Smith et al. | 361/695 |
| 6,674,641 | B2* | 1/2004 | Jensen et al. | 361/679.48 |
| 6,839,233 | B2* | 1/2005 | Cravens et al. | 361/695 |
| 6,851,925 | B2* | 2/2005 | Chuang | 415/126 |
| 7,236,361 | B2* | 6/2007 | Cote et al. | 361/695 |
| 7,379,300 | B1* | 5/2008 | Chen | 361/695 |
| 7,445,430 | B2* | 11/2008 | Kao et al. | 415/213.1 |
| 7,481,704 | B2* | 1/2009 | Kao et al. | 454/184 |
| 7,511,955 | B2* | 3/2009 | Yin | 361/695 |
| 7,535,709 | B2* | 5/2009 | Fan et al. | 361/695 |
| 7,537,480 | B2* | 5/2009 | Li | 439/485 |
| 7,586,746 | B2* | 9/2009 | Liu | 361/695 |
| 7,688,585 | B2* | 3/2010 | Yin | 361/695 |
| 7,697,286 | B2* | 4/2010 | Hung | 361/694 |
| 7,697,287 | B2* | 4/2010 | Yin | 361/695 |
| 7,699,692 | B2* | 4/2010 | Yin | 454/184 |
| 7,701,713 | B2* | 4/2010 | Li | 361/695 |
| 7,771,165 | B2* | 8/2010 | Chen | 415/213.1 |
| 7,948,755 | B1* | 5/2011 | Guan | 361/695 |
| 8,047,780 | B2* | 11/2011 | Chen et al. | 415/213.1 |
| 8,075,248 | B2* | 12/2011 | Yin et al. | 415/60 |
| 8,246,301 | B2* | 8/2012 | Li | 415/213.1 |
| 2007/0153477 | A1* | 7/2007 | Liang | 361/695 |
| 2008/0101019 | A1* | 5/2008 | Tao | 361/695 |

\* cited by examiner

*Primary Examiner* — Michail V Datskovskiy
(74) *Attorney, Agent, or Firm* — Altis Law Group, Inc.

(57) ABSTRACT

A fan fixing device for fixing fan units includes two parallel first sidewalls, two parallel second sidewalls, and a number of fixing members. Each first sidewall defines a number of vent ports and includes a vertical plate, a lower plate, and an L-shaped engagement member. The lower plate and the engagement member are positioned at opposite sides of the vertical plate. The second sidewalls are connected between the first sidewalls. The second sidewalls and the first sidewalls cooperatively form a receiving room. The fixing members engage with between the engagement members of the first sidewalls, the fixing member is configured for securing the fan units to the two first sidewalls in the receiving room.

13 Claims, 6 Drawing Sheets

FAN FIXING DEVICE AND FAN MODULE HAVING SAME

BACKGROUND

1. Technical Field

The present disclosure relates to heat dissipation technologies and, particularly, to a fan fixing device, and a fan module having such fan fixing device.

2. Description of Related Art

Many electronic devices such as central processing units (CPUs) generate a lot of heat. The heat must be efficiently removed from such electronic devices to ensure normal operation of such electronic devices. Generally, a number of fans are mounted in the electronic devices to remove heat therefrom. Hence, fan that dissipates heat in electronic devices is very important in the design of electronic devices.

DETAILED DESCRIPTION

Figure 1:
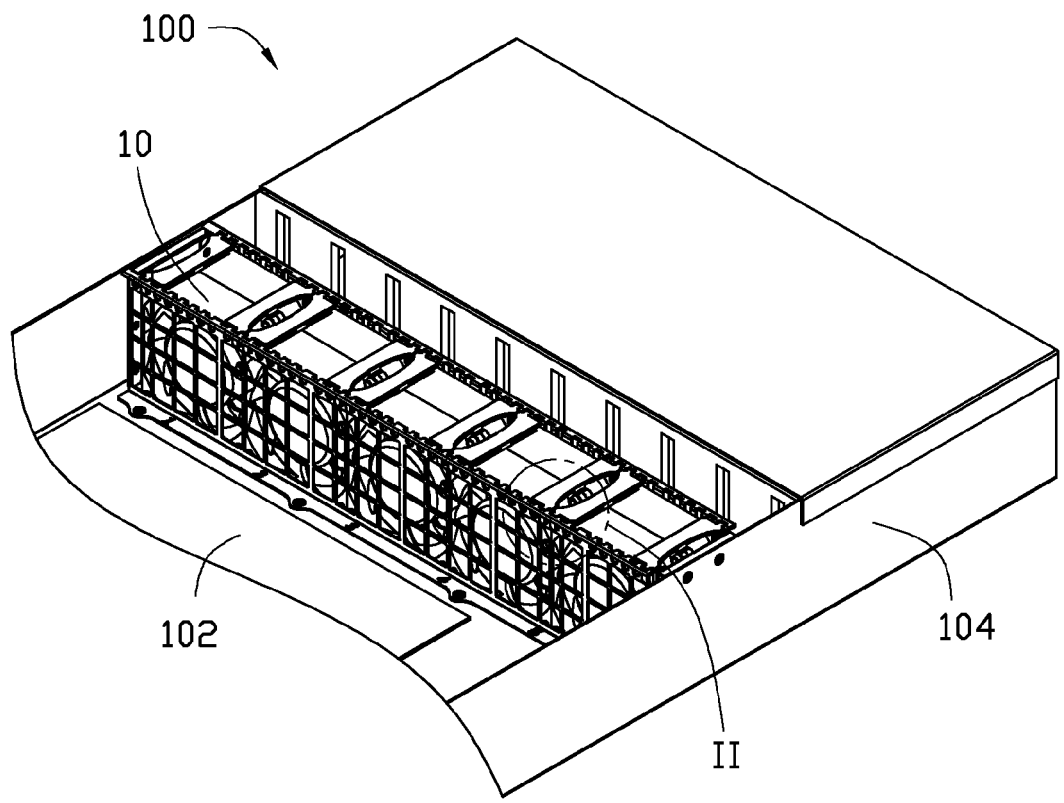
FIG. 1 is a schematic, isometric view of an electronic device including a fan module, according to a first exemplary embodiment.

Referring to FIG. 1, an electronic device 100, according to a first exemplary embodiment, includes a heat source 102, a housing 104 and a fan module 10. The heat source 102 and the fan module 10 are mounted in the housing 104. The fan module 10 is configured for dissipating heat generated by the heat source 102. In this embodiment, the electronic device 100 may be a personal computer. The heat source 102 may be a CPU.

Figure 2:
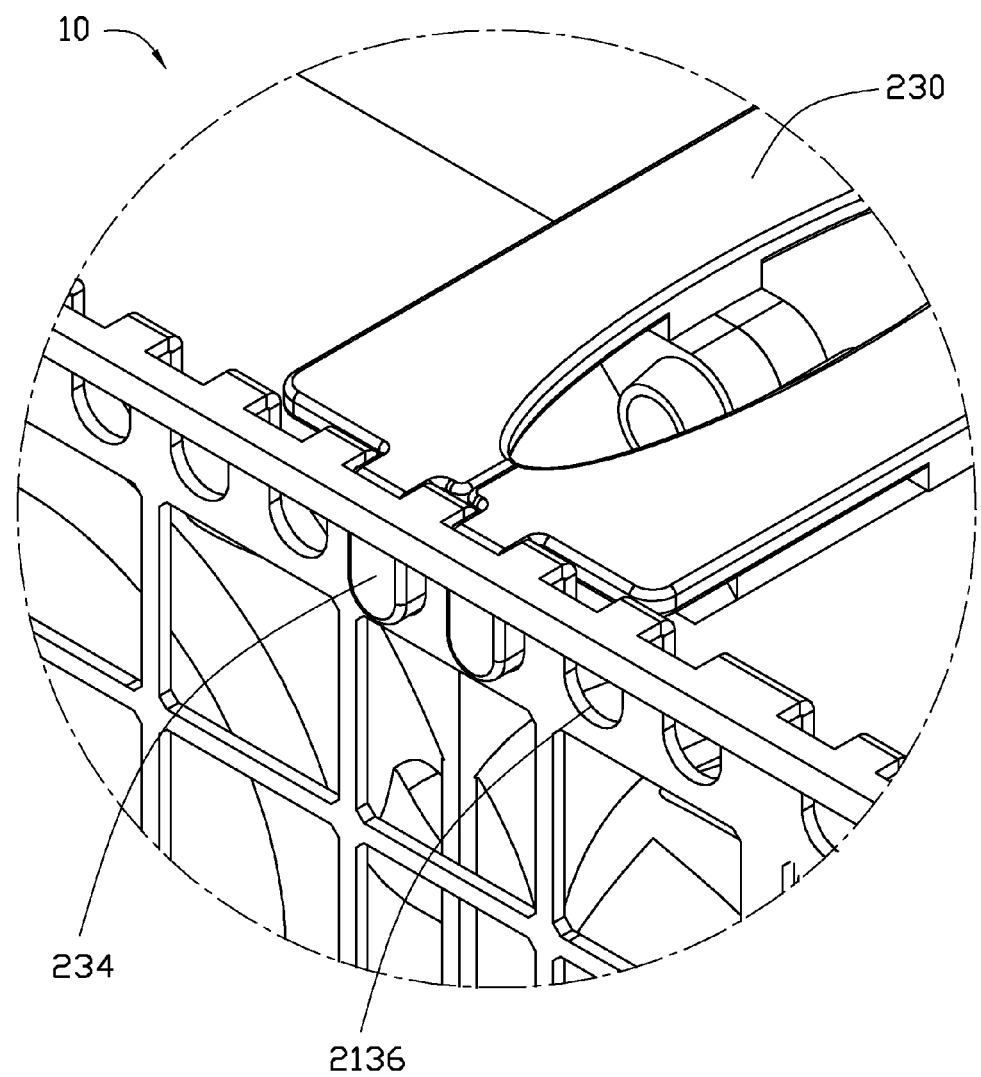
FIG. 2 is an enlarged view of circled section II of FIG. 1.
Figure 3:
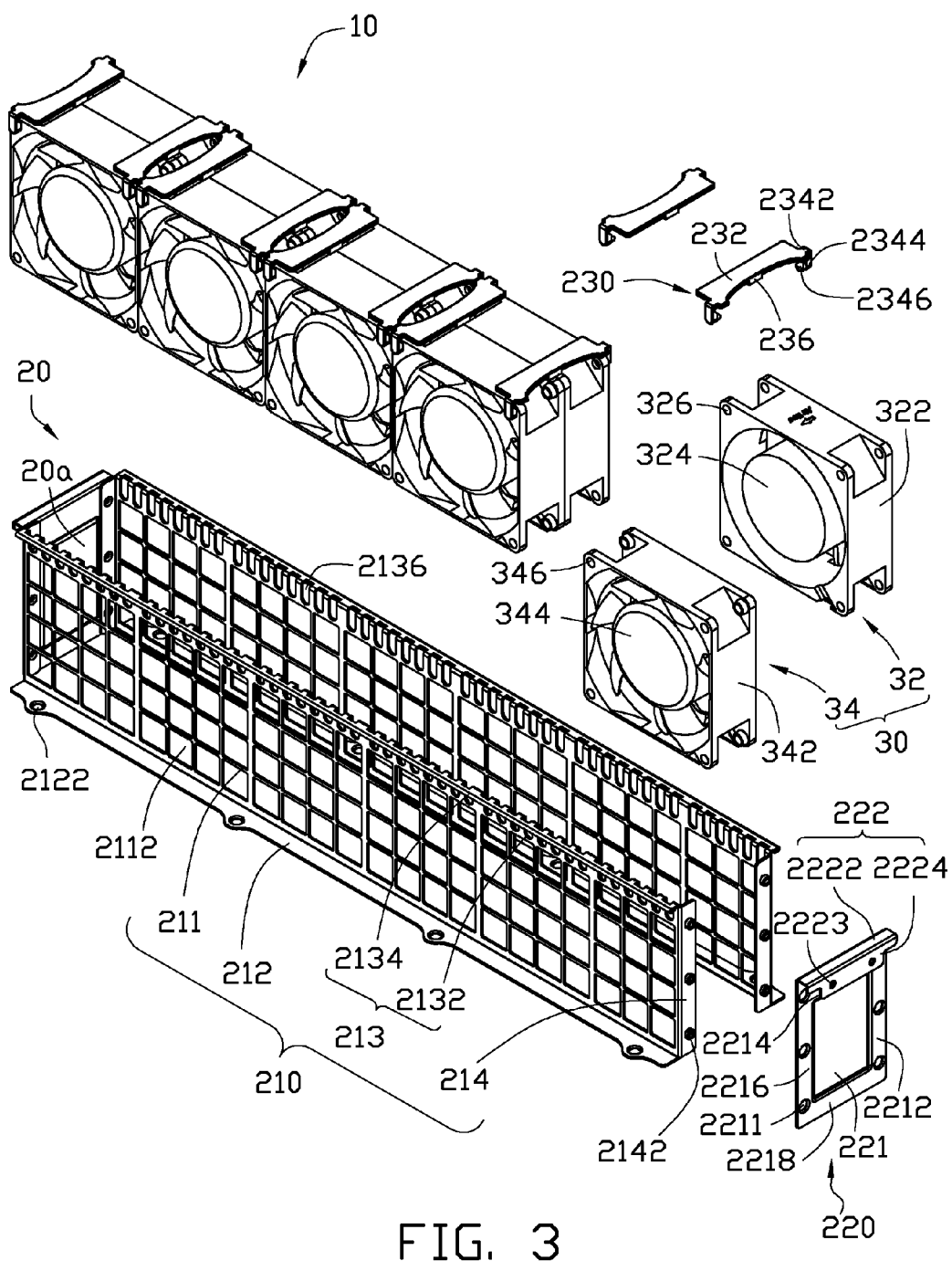
FIG. 3 is a partially exploded view of the fan module of the electronic device of FIG. 1.

Referring to FIGS. 2-3, the fan module 10 includes a fan fixing device 20 and five fan units 30.

The fan fixing device 20 includes two parallel first sidewalls 210, two parallel second sidewalls 220, and ten fixing members 230. Each second sidewall 220 is perpendicular to the corresponding first sidewalls 210. The two first sidewalls 210 and the two second sidewalls 220 cooperatively form a cube receiving room 20a. The fixing members 230 fix the five fan units 30 in the receiving room 20a.

Each first sidewall 210 includes a vertical plate 211, a lower plate 212, an L-shaped engagement member 213, and two lateral plates 214. The lower plate 212 and the engagement member 213 are positioned at opposite sides of the vertical plate 211. A number of vent ports 2112 are defined in the vertical plate 211. The vent ports 2112 are arranged in a square fashion. The lower plate 212 perpendicularly extends from a lower end of the vertical plate 211 away from the receiving room 20a. Four through holes 2122 are defined in each lower plate 212 and are apart from each other. The engagement member 213 includes a vertical portion 2132 and a horizontal portion 2134. The vertical portion 2132 extends from an upper end of the vertical plate 211. The horizontal portion 2134 perpendicularly extends from the vertical portion 2132 away from the receiving room 20a. A number of engagement holes 2136 are defined in the engagement member 213. The engagement holes 2136 are arranged in a line perpendicular to the second sidewall 220 and are apart from each other. Each engagement hole 2136 is defined in an intersection of the vertical portion 2132 and the horizontal portion 2134. The two lateral plates 214 extend from opposite lateral sides of the vertical plate 211 toward the receiving room 20a, respectively. Three first threaded holes 2142 are defined in each lateral plate 214.

Each second sidewall 220 includes a plane plate 221 and a L-shaped plate 222. The plane plate 221 includes a right side 2212, an upper side 2214, a left side 2216, and a lower side 2218. The right side 2212 is opposite to the left side 2216. The upper side 2214 is opposite to the lower side 2218. The right side 2212, the upper side 2214, the left side 2216, and the lower side 2218 connect each other end-to-end. Six second threaded holes 2211 are defined in the plane plate 221. Three second threaded holes 2211 are arranged in a line along the right side 2212. Other three second threaded holes 2211 are arranged in a line along the left side 2216. The L-shaped plate 222 includes a first portion 2222 and a second portion 2224. The first portion 2222 perpendicularly extends from the upper side 2214 away from the receiving room 20a. The second portion 2224 perpendicularly extends from the first portion 2222 toward the lower side 2218. The second portion 2224 is substantially parallel to the plane plate 221. Two third threaded holes 2223 are defined in the second portion 2224 and are apart from each other.

Each fixing member 230 includes a body portion 232, two engagement portions 234, and a contact portion 236. The two engagement portions 234 are positioned at opposite sides of the body portion 232. The contact portion 236 is positioned in the middle of the body portion 232. Each engagement portion 234 includes a first protrusion 2342, a second protrusion 2344, and a third protrusion 2346. The first protrusion 2342 extends from the body portion 232 along the length of the body portion 232. The second protrusion 2344 perpendicularly extends from the first protrusion 2342. The third protrusion 2346 perpendicularly extends from the second protrusion 2344 toward the contact portion 236.

Each fan unit 30 includes a first fan 32 and a second fan 34. The first fan 32 includes a first frame 322 and a first blade unit 324 received in the first frame 322. Two first fixing holes 326 are defined in two corners of the first frame 322. Each second fan 34 includes a second frame 342 and a second blade unit 344 received in the second frame 342. Two second fixing holes 346 are defined in two corners of the second frame 342. Each first fan 32 is connected to the corresponding second fan 34 to form one fan unit 30. The five first fans 32 and the five second fans 34 are received in the receiving room 20a. The five first fans 32 are arranged in a line perpendicular to the second sidewall 220. The five second fans 34 are arranged in a line perpendicular to the second sidewall 220.

In assembly, a number of bolts (not shown) extend through the second threaded holes 2211 and engage in the first threaded holes 2142 so that the second sidewalls 220 are connected to the first sidewalls 210 and the receiving room 20a is formed. Each first fan 32 is connected to a corresponding second fan 34 to form the fan unit 30, thereby five fan units 30 are formed. One third protrusion 2346 of each fixing member 230 engages in the first fixing hole 326, and the other third protrusion 2346 of each fixing member 230 engages in the second fixing hole 346. The contact portion 236 abuts the first fan 30 and the second fan 40. The five fan units 30 are received in the receiving room 20a. The first protrusion 2342 and the second protrusion 2344 pass through the engagement hole 2136, the third protrusion 2346 engages in the engagement hole 2136, thereby the fixing member 230 secures the fan units 30 to the two first sidewalls 210, and the fan module 10 is formed. Bolts (not shown) extend through the through holes 2122 and engage in the housing 104, thereby the fan fixing device 20 with the fan units 30 are fixed in front of the heat source 102 in the housing 104. Therefore, the fan units 30 can efficiently dissipate heat generated by the heat source 102.

Figure 4:
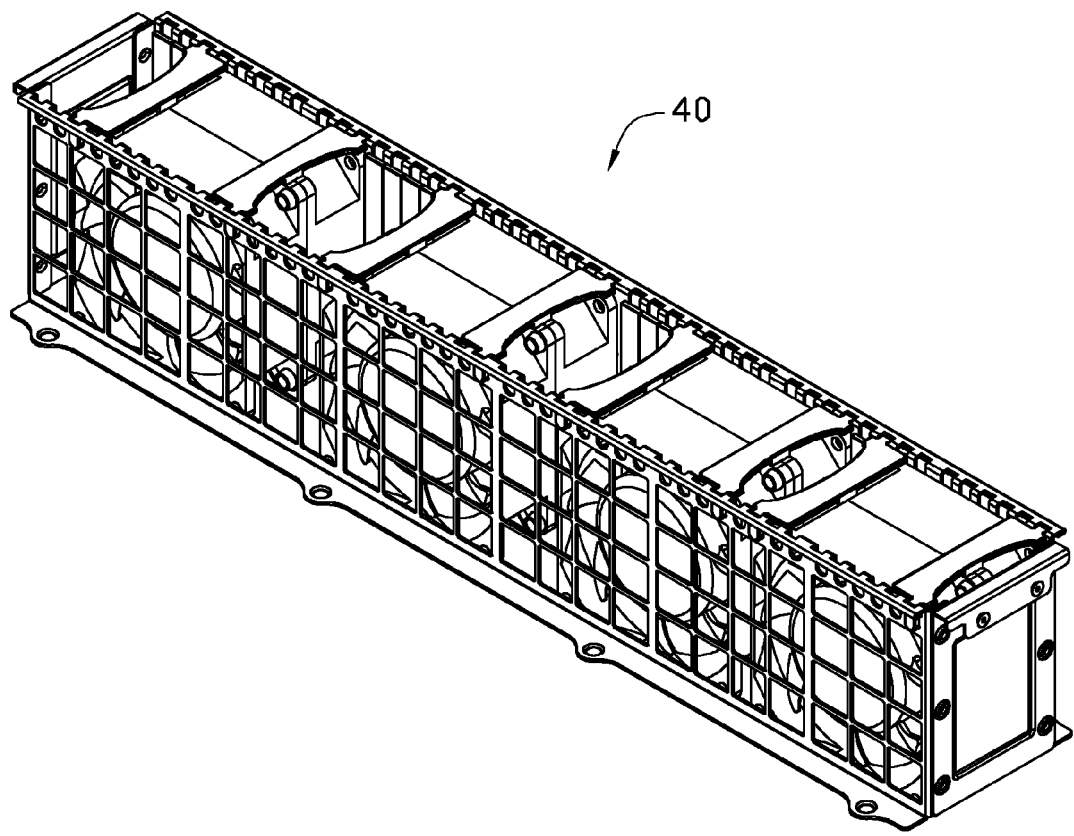
FIG. 4 is a schematic, isometric view of a fan module including tabs, according to a second exemplary embodiment.
Figure 5:
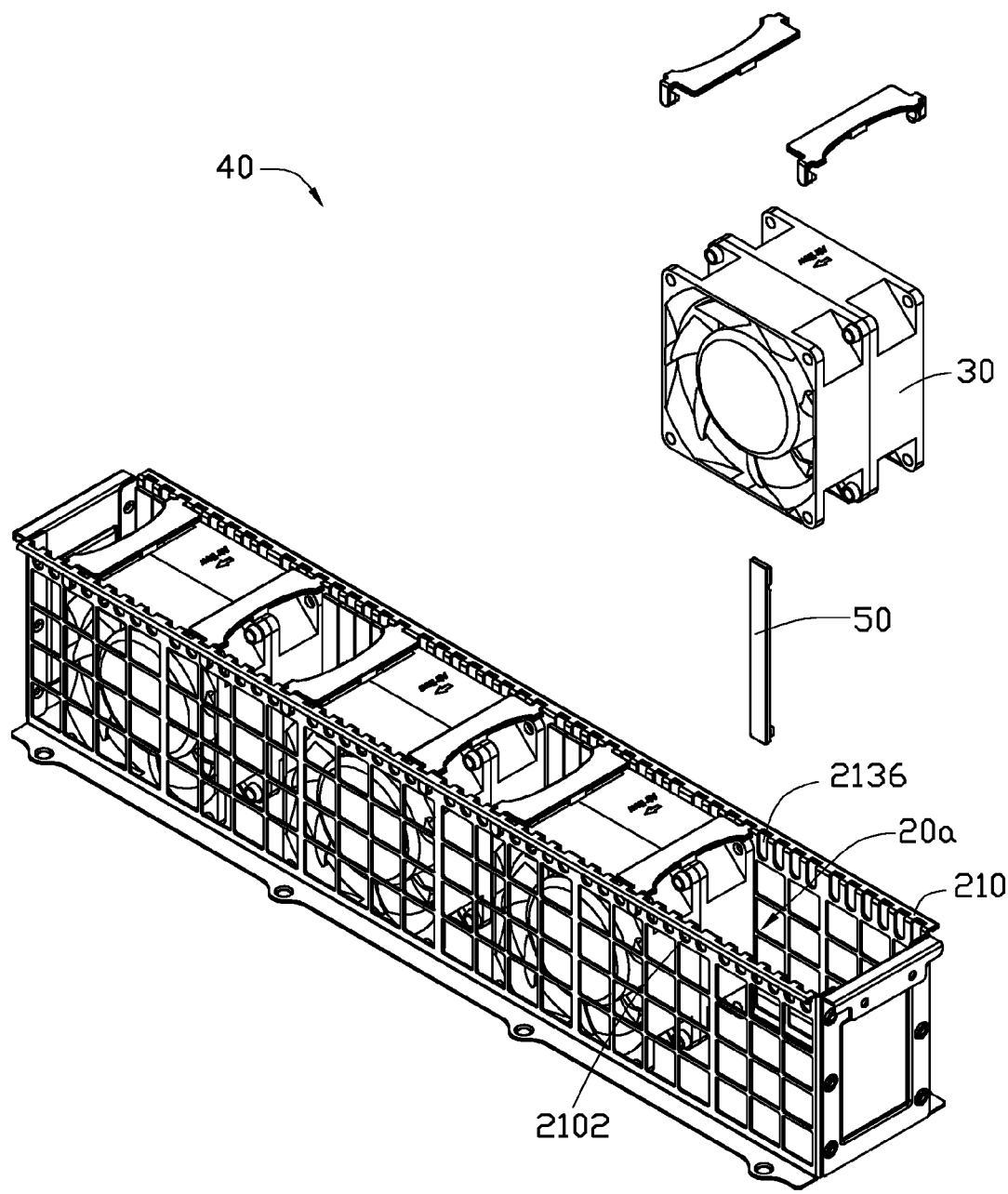
FIG. 5 is a partially exploded, isometric view of the fan module of FIG. 4.
Figure 6:
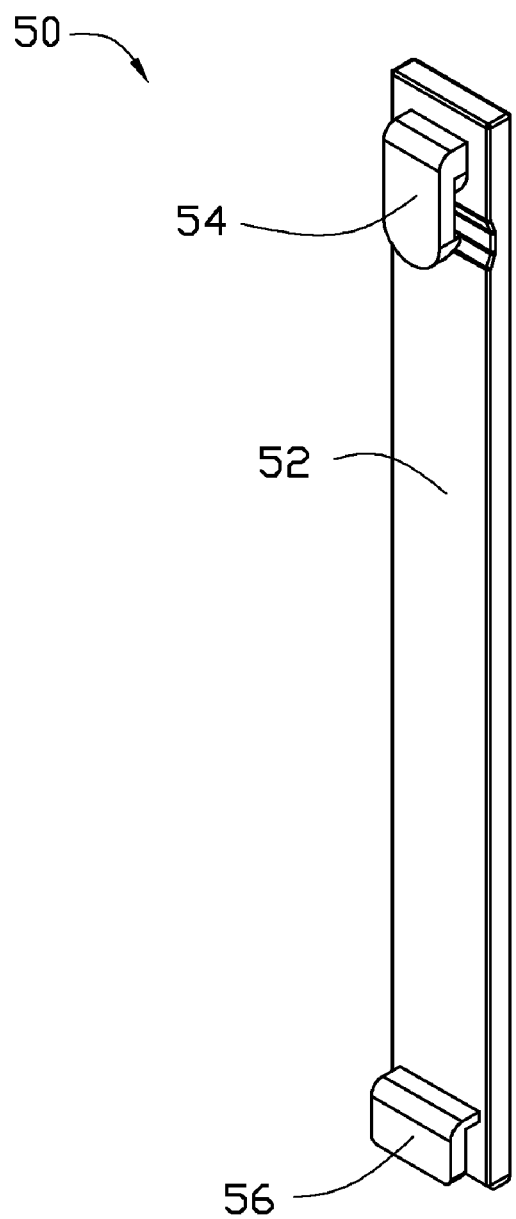
FIG. 6 is a schematic, isometric view of one of the tabs of FIG. 5.

Referring to FIGS. 4-6, a fan module 40, according to a second exemplary embodiment, is shown. The differences between the fan module 40 of this embodiment and the fan module 10 of the first embodiment are: the fan module 40 further includes ten elongated tabs 50. The number of the fan unit 30 is four. The tabs 50 are mounted in the receiving room 20a.

Each tab 50 includes a blocking plate 52, a first clasp 54, and second clasp 56. The first clasp 54 and the second clasp 56 extend from opposite sides of the blocking plate 52. The first clasp 54 engages in the corresponding engagement hole 2136, and the second clasp 56 engages in the corresponding vent port 2112, thereby the blocking plates 52 cooperating with the four fan units 30 to seal the vent ports 2112 of the first sidewalls 210 away the heat source 102.

Advantages of the fan module 40 of the second embodiment are similar to those of the fan module 10 of the first embodiment. Furthermore, the tabs 50 cooperate with the four fan units 30 to seal the vent ports 2112, thus preventing backflow of air generated by the fan units 30 through the vent ports 2112 away from the heat source 102.

It is to be understood, however, that even though numerous characteristics and advantages of the present embodiments have been set fourth in the foregoing description, together with details of the structures and functions of the embodiments, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A fan fixing device for fixing fan units, comprising:
    two parallel first sidewalls, each first sidewall defining a plurality of vent ports, each first sidewall comprising a vertical plate, a lower plate, and an L-shaped engagement member, the lower plate and the engagement member positioned at opposite sides of the vertical plate;
    two parallel second sidewalls connected between the first sidewalls, the second sidewalls and the first sidewalls cooperatively forming a receiving room; and
    a plurality of fixing members engaging with and between the engagement members of the first sidewalls, the fixing member configured for securing the fan units to the two first sidewalls in the receiving room.

2. The fan fixing device as claimed in claim 1, wherein each first sidewall further comprises two lateral plates extending from opposite lateral sides of the vertical plate, and the second sidewalls are connected to the respective lateral plates.

3. The fan fixing device as claimed in claim 2, wherein each engagement member comprises a vertical portion and a horizontal portion, the vertical portion extends from an upper end of the vertical plate, the horizontal portion perpendicularly extends from the vertical portion away from the receiving room, a plurality of engagement holes are defined in the engagement member, and the fixing members engage in the engagement holes.

4. The fan fixing device as claimed in claim 3, wherein each engagement hole is defined in an intersection of the vertical portion and the horizontal portion, the engagement hole are arranged in a line perpendicular to the second sidewall.

5. The fan fixing device as claimed in claim 3, wherein each lateral plate defines a plurality of first threaded holes, each second sidewall comprises a plane plate, a plurality of second threaded holes are defined in the plane plate corresponding to the first thread holes, a plurality of bolts extend through the second threaded holes and engage in the respective first threaded holes to fix the second sidewalls to the first sidewalls.

6. The fan fixing device as claimed in claim 3, wherein each fixing member comprises a body portion, two engagement portions, and a contact portion, the engagement portions are positioned at opposite sides of the body portion, the contact portion is positioned in the middle of the body portion, the engagement portions configured for engaging with the fan units and engaging in the engagement holes, each contact portion configured for abutting against the fan unit.

7. A fan module comprising:
    a plurality of fan units, each fan unit comprising a first fan and a second fan attached to the first fan, the first fan defining two first fixing holes, the second fan defining two second fixing holes; and
    a fan fixing device comprising:
        two parallel first sidewalls, each first sidewall defining a plurality of vent ports, each first sidewall comprising a vertical plate, a lower plate, and an L-shaped engagement member, the lower plate and the engagement member positioned at opposite sides of the vertical plate;
        two parallel second sidewalls connected between the first sidewalls, the second sidewalls and the first sidewalls cooperatively forming a receiving room; and
        a plurality of fixing members engaging with and between the engagement members of the first sidewalls and engaging in the first fixing holes and the second fixing holes thereby securing the fan units to the first sidewalls in the receiving room.

8. The fan module as claimed in claim 7, wherein each first sidewall further comprises two lateral plates extending from opposite lateral sides of the vertical plate, the second sidewalls are connected to the respective lateral plates.

9. The fan module as claimed in claim 8, wherein each engagement member comprises a vertical portion and a horizontal portion, the vertical portion extends from an upper end of the vertical plate, the horizontal portion perpendicularly extends from the vertical portion away from the receiving room, a plurality of engagement holes are defined in the engagement member, and the fixing members engage in the engagement holes.

10. The fan module as claimed in claim 9, wherein each engagement hole is defined in an intersection of the vertical portion and the horizontal portion, the engagement hole are arranged in a line perpendicular to the second sidewall.

11. The fan module as claimed in claim 9, wherein each lateral plate defines a plurality of first threaded holes, each second sidewall comprises a plane plate, a plurality of second threaded holes are defined in the plane plate corresponding to the first thread holes, a plurality of bolts extend through the second threaded holes and engage in the respective first threaded holes to fix the second sidewalls to the first sidewalls.

12. The fan module as claimed in claim 9, wherein each fixing member comprises a body portion, two engagement portions, and a contact portion, the engagement portions are positioned at opposite sides of the body portion, the contact portion is positioned in the middle of the body portion, the engagement portions configured for engaging with the fan units and engaging in the engagement holes, each contact portion configured for abutting against the fan unit.

13. An electronic device comprising:
- a housing;
- a heat source received in the housing; and
- a fan module received in the housing and facing the heat source, the fan module comprising:
  - a plurality of juxtaposed fan units, each fan unit comprising a first fan and a second fan attached to and aligned with the first fan, the first fan defining two first fixing holes, the second fan defining two second fixing holes; and
  - a fan fixing device comprising:
    - two parallel first sidewalls, each first sidewall defining a plurality of vent ports, each first sidewall comprising a vertical plate, a lower plate, and an L-shaped engagement member, the lower plate and the engagement member positioned at opposite sides of the vertical plate;
    - two parallel second sidewalls connected between the first sidewalls, the second sidewalls and the first sidewalls cooperatively forming a receiving room; and
    - a plurality of fixing members engaging with and between the engagement members of the first sidewalls and engaging in the first fixing holes and the second fixing holes thereby securing the fan units to the first sidewalls in the receiving room.

* * * * *